United States Patent [19]
Master et al.

[11] Patent Number: 6,098,867
[45] Date of Patent: Aug. 8, 2000

[54] AUTOMATED BRUSH FLUXING SYSTEM FOR APPLICATION OF CONTROLLED AMOUNT OF FLUX TO PACKAGES

[75] Inventors: Raj N. Master; Maria G. Guardado; Mohammad Zubair Khan, all of San Jose, Calif.

[73] Assignee: Advanced Micro Devices, Inc., Sunnyvale, Calif.

[21] Appl. No.: 09/040,511

[22] Filed: Mar. 17, 1998

[51] Int. Cl.⁷ .............. B23K 1/00; B23K 1/20; B23K 31/02
[52] U.S. Cl. ............ 228/102; 228/35; 228/214; 228/223
[58] Field of Search ............... 228/102, 13, 14, 228/15.1, 34, 35, 36, 37, 38, 39, 40, 43, 205, 207, 214, 223, 224

[56] References Cited

U.S. PATENT DOCUMENTS

| | | | |
|---|---|---|---|
| 3,806,978 | 4/1974 | Takeuchi ................... | 15/21 D |
| 3,841,751 | 10/1974 | Draugelis et al. .......... | 355/4 |
| 4,233,935 | 11/1980 | Uehara et al. ............ | 118/657 |
| 4,724,170 | 2/1988 | Boone et al. ............. | 427/284 |
| 5,065,692 | 11/1991 | Hollesen et al. ......... | 118/302 |
| 5,144,711 | 9/1992 | Gill, Jr. ................... | 15/97.1 |
| 5,324,406 | 6/1994 | Anderson et al. ......... | 204/224 R |
| 5,328,085 | 7/1994 | Stoops et al. ............. | 228/33 |
| 5,475,889 | 12/1995 | Thrasher et al. .......... | 15/88.3 |

OTHER PUBLICATIONS

120 USPQ 193 (CCPA 1958), 1958.

*Primary Examiner*—Patrick Ryan
*Assistant Examiner*—Kiley Stoner
*Attorney, Agent, or Firm*—H. Donald Nelson

[57] ABSTRACT

An automated method of applying flux to substrate on which a semiconductor chip is to be assembled in a flip chip configuration by applying a controlled amount of flux to the substrate by a brush that applies the flux to the substrate in a programmed pattern of strokes thereby overcoming the surface tension of the flux/substrate surface. The programmed pattern of brush strokes is determined empirically for the specific combination of substrate and chip that is being assembled and is thus repeatable and operator independent. The empirically determined program also determines the amount of flux that will be applied to the substrate for the specific combination of substrate and chip being assembled. The empirically determined program is applied to a mechanical stage that moves the brush and to a flux reservoir by a CPU.

7 Claims, 3 Drawing Sheets

AUTOMATED BRUSH FLUXING SYSTEM FOR APPLICATION OF CONTROLLED AMOUNT OF FLUX TO PACKAGES

BACKGROUND OF THE INVENTION

1. Field of the Invention

This invention relates generally to a method of assembly of a semiconductor device in a flip chip configuration. More specifically this invention relates to a method of applying flux to the substrate in a semiconductor device in a flip chip configuration. Even more specifically this invention relates to an automated method of applying flux in a controlled amount to the substrate in a semiconductor device via a brush during a programmed pattern of strokes.

2. Discussion of the Related Art

The most important objective of semiconductor packaging is to support the original design objective and intent of the integrated circuit chips. In today's technology environment, there is an ever-increasing requirement to increase the integration of circuits onto a single semiconductor chip. At the same there is a requirement to increase the performance of the semiconductor chip, whether it is a memory chip, a microprocessor chip, a telecommunications chip or any other type of semiconductor chip. As more and more circuit functions are added to a chip, the number of interconnections also increases dramatically. An overriding factor in the increase of integration and increase of performance is the requirement to reduce the cost of the final product.

An early flip chip method of packaging semiconductors was developed in the early 1960s by IBM as a possible replacement for the expensive, unreliable, low-productivity, and manually operated face-up wire-bonding technology. However, because high-speed automatic wire bonders for the most part met the needs of the semiconductor industry there was not an aggressive development effort expended to improve the flip chip technology methods. Flip chip technology is defined as mounting the semiconductor chip to a substrate with any kind of interconnect materials and methods such as fluxless solder bumps, tape-automated bonding (TAB), wire interconnects, conductive polymers, anisotropic conductive adhesives, metallurgy bumps, compliant bumps, and pressure contacts as long as the active chip surface is facing the substrate.

As a direct result of the higher requirements of package density, performance, and interconnection, the limitations of face-up wire bonding technology, and the growing use of multichip module technology there is a need to improve the flip chip technology and to decrease the cost of the flip chip technology at the same time. The flip chip interconnects are being used in the semiconductor industry primarily because of their high I/O density capability, small profiles, and good electrical performance. Demands on performance, reliability, and cost have resulted in the development of a variety of flip chip technologies using solder, conductive epoxy, hard metal bump (such as gold) and anisotropic conductive epoxy interconnects. Among these materials, solders have remained a preferred choice as the material forming electrical connections in flip chip assemblies.

Solder flip chip interconnect systems consist of essentially three basic elements. These include the chip, the solder bump, and the substrate. The bumps are first deposited on a wafer and reflowed. The wafer is then diced into chips. The chips are flipped over, aligned to a substrate, tacked, and reflowed. An underfill may be used to improve the reliability of the interconnects. Each of these elements and the processes used to assemble them together affect the performance and the cost of the interconnect system. Therefore, the performance and cost must be compared on the basis of the interconnect system as a whole, and not merely on any single element of the interconnect assembly.

The materials and processes involved in the manufacture of the flip chip interconnect system determine its performance. The semiconductor device or the chip may be silicon or gallium arsenide. The bond pad metallization on the wafer can be Ni—Au, Cr—Cu—Au, TiW—Cu, Ti—Cu, or TiW—Au. The bump material can be one of a variety of Pb-based or Pb-free solders. The substrate can be silicon, alumina, glass, or one of a variety of organic substrates. The substrate metallization can be gold or copper. Underfills are used primarily to improve reliability of flip chip interconnect systems. These materials fill the gap between the chip and substrate around the solder joints, reducing the thermal stresses imposed on the solder joint.

The process step used in the manufacture of the interconnect systems can be varied and include process technologies such as plating, evaporation, wire bumping, dispensing, and printing. The reflow process may be performed in air with flux or in a controlled ambient. Flip chip bonding processes include those based on the controlled-collapse chip connection (C4) approach or those in which the geometry of the bump is controlled by the bonding equipment.

The cost of manufacturing a solder flip chip interconnect system is related to the manufacturing process technologies. Some basic elements of a cost model are the materials cost, number of process steps, equipment costs, floor space, and labor. The number of process steps has a significant influence on the cost, since they also affect equipment costs, floor space, and labor. A smaller number of process steps invariably results in lower costs. A significant reduction in cost is also achieved when a manual process step that requires an interruption of the process flow can be replaced by an automated process step.

In the flip chip interconnection system, after the bumps are formed on the substrate and before the chip is flipped and placed on the substrate a sticky flux is applied to the substrate and the bumps. This flux provides the adhesion needed to hold the chips in place until the reflow process takes place. The methods available to apply flux to the substrate include manually brushing the flux onto the substrate, die dip fluxing or spraying the flux onto the substrate. However, the quality of the process of manually brushing the flux onto the substrate is dependent upon the training of the person doing the brushing, the time of day (how long the person has been working) etc. For example, if the flux is not put on in sufficient thickness the bumps or pads may not be covered. Alternatively, if the flux is put on too thick, the die will float off of the substrate during reflow due to the boiling action of the flux. The quality of the process of spraying the flux onto the substrate depends upon the material of the substrate. Different substrate materials/flux materials have different surface tensions that cause the flux materials to bead. The beading of the flux material has a serious deleterious effect of the quality of the interconnect assembly.

Therefore, what is needed is an automated method and process to apply flux to the substrate to achieve a controlled amount of flux to the substrate so that all pads or bumps are uniformly covered and that is not affected by the surface tension of the substrate material.

SUMMARY OF THE INVENTION

According to the present invention, the foregoing and other objects and advantages are attained by an automated method of applying flux to a substrate on which a semiconductor chip is to be assembled in a flip chip configuration. A controlled amount of flux is applied to the substrate by a brush that applies the flux to the substrate in a programmed pattern of strokes. The brush is attached to a movable mechanical stage that is controlled by a program in a CPU. The program in the CPU is an empirically determined program determined for the specific combination of substrate and chip being assembled. The empirically determined program is based upon uniformity of flux coverage of bumps on the specific semiconductor device being assembled and an optimization of manufacturing throughput of the specific semiconductor device being assembled.

In accordance with an aspect of the invention, the CPU controls the motion of the brush in three dimensions. The brush is caused to contact the substrate with an initial force and then is caused to back off until a programmed height above the substrate is achieved before the programmed pattern of strokes is begun.

The automated programmed mechanical application method thus applies a controlled amount of flux to the substrate to achieve a desired uniform thickness by overcoming the surface tension of the flux/substrate interface. The empirically determined automated programmed mechanical application for each substrate/chip/flux combination is thus repeatable and operator independent.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
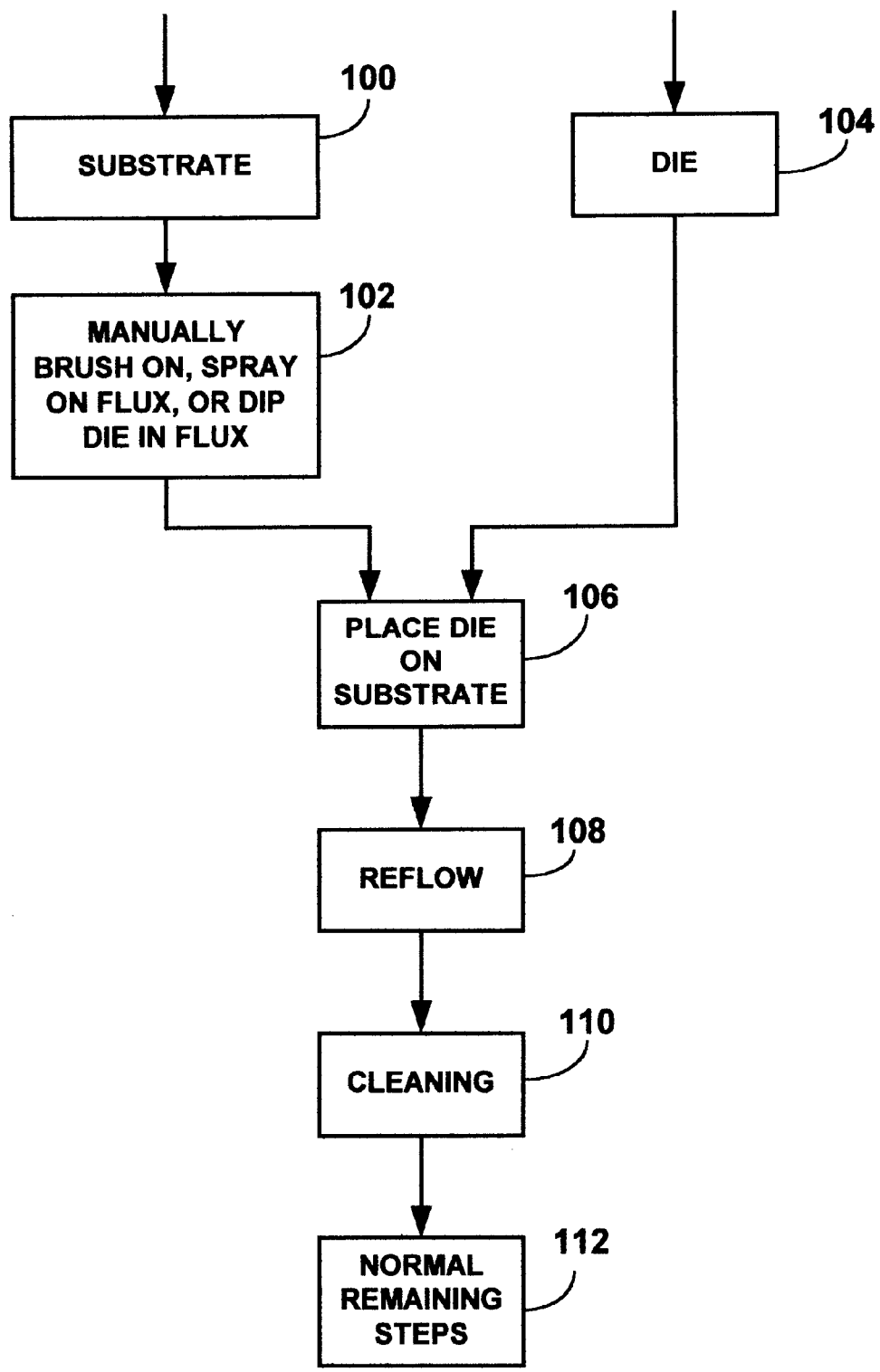
FIG. 1 is a flow diagram showing a prior art method of attaching a chip face down on a substrate package.

FIG. 1 is a flow diagram showing a prior art method of assembling a chip and a substrate in a flip chip configuration.

FIG. 1 shows a substrate, indicated at 100 that has been formed by standard methods in the semiconductor manufacturing art. The substrate could be silicon, alumina (ceramic), glass, or one of a variety of organic substrates. Bond pads or solder bumps are formed on the substrate that will be electrically connected to corresponding structures on a die. Flux is applied to the substrate as indicated at 102 by manually brushing or spraying the flux onto the appropriate portion of the substrate or by dipping the die into the flux. A major quality issue is present at the manual application step because the quality of the applied flux varies as to the person that brushes on the flux. Because the nature of the step is repetitious, a worker may not have the motivation to maintain the quality of the flux application. In addition, turnover in these types of jobs is high and there is a requirement for continuous training of personnel. The quality of the sprayed flux varies because the surface tension of the flux on different substrates varies widely. In the case of some of the substrate materials, the sprayed on flux beads-up and as a result is not uniformly spread over the substrate and the bumps. The die, indicated at 104 is a normal die and can be made on a silicon substrate or a gallium arsenide substrate. Bond pads or solder bumps are formed on the die and correspond to the bond pads or bumps formed on the substrate as discussed above. The bump material can be a variety of Pb-based or Pb-free solders. The bond pad metallization of the wafer can be Ni—Au, Cr—Cu—Au, TiW—Cu, Ti—Cu, or TiW—Au. The die is placed on the substrate in a flip chip configuration as indicated at 106. A flip chip configuration is one in which the active surface area is placed "face-down" onto the substrate. The substrate/chip combination is then heated to cause the solder to reflow as indicated at 108. The substrate/chip combination is cleaned as indicated at 110 and subjected to normal manufacturing steps as indicated at 112. The reflow, cleaning and remaining steps are standard in the semiconductor packaging art and will not be further discussed.

Figure 2:
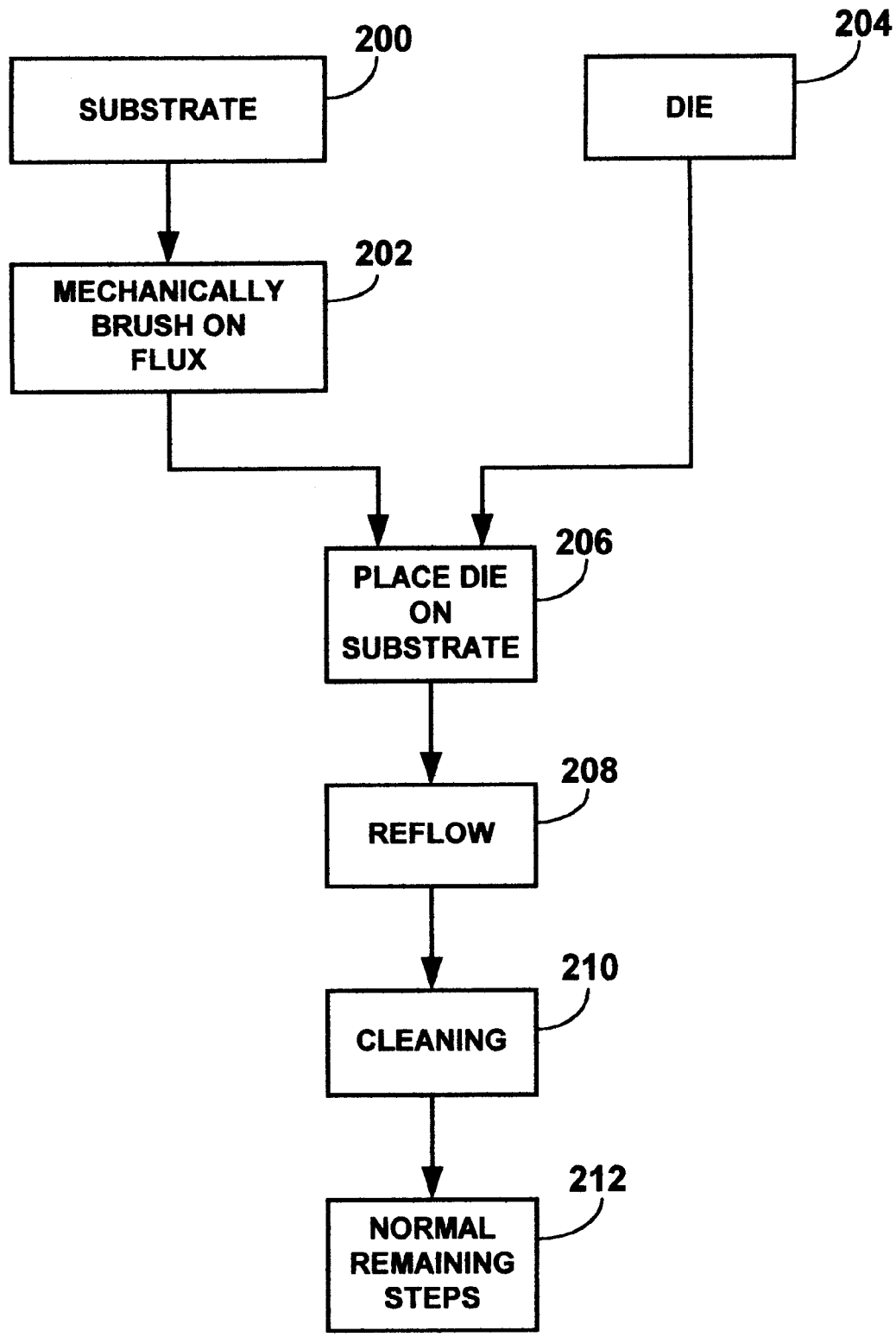
FIG. 2 is a flow diagram showing a method of attaching a chip face down on a substrate package in accordance with the present invention.

FIG. 2 is a flow diagram showing the method of assembling a chip and a substrate in a flip chip configuration in accordance with the present invention. FIG. 2 shows a substrate, indicated at 200 that has been formed by standard methods in the semiconductor manufacturing art. As noted above, the substrate could be silicon, alumina (ceramic), glass, or one of a variety of organic substrates. The flux is applied to the substrate as indicated at 202 by an automated process by mechanically brushing on the flux in a programmed pattern of brush strokes. The details of the programmed automated mechanical application of flux will be discussed below in conjunction with FIG. 3B. The programmed automated mechanical application of flux to the substrate solves the problems encountered with the manual application of flux or the application of flux by spraying discussed above in conjunction with FIG. 1. The programmed automated mechanical application of flux provides a uniform layer of flux on the substrate and bumps. The quality of the application is consistent from one substrate to the next. The programmed automated mechanical application of flux by brush avoids the beading problem caused by some of the different surface tensions caused by the interaction of different substrate materials and the flux. As will be discussed below, the programmed automated mechanical application of flux is achieved by a programmed pattern of brush strokes that has been empirically determined for the specific substrate and chip being assembled. An additional advantage is that the assembly system can be quickly reprogrammed if it is desired to assemble a different substrate/chip combination. The die (chip) as indicated at 204 can be made on a silicon substrate or gallium arsenide substrate. Interconnects on the die can be either bumps or pads. The bump material can be a variety of Pb-based or Pb-free solders. The bond pad metallization of the wafer can be Cr—Cu—Au, TiW— Cu, Ti—Cu, or TiW—Au. The die is placed on the substrate in a flip chip configuration as indicated at 206. A flip chip configuration is one in which the active surface area is placed "face-down" onto the substrate. The substrate/chip combination is then heated to cause the solder to reflow as indicated at 208. The substrate/chip combination is cleaned as indicated at 210 and subjected to normal manufacturing steps as indicated at 212. The reflow, cleaning and remaining steps are standard in the semiconductor packaging art and will not be further discussed.

Figure 3A:
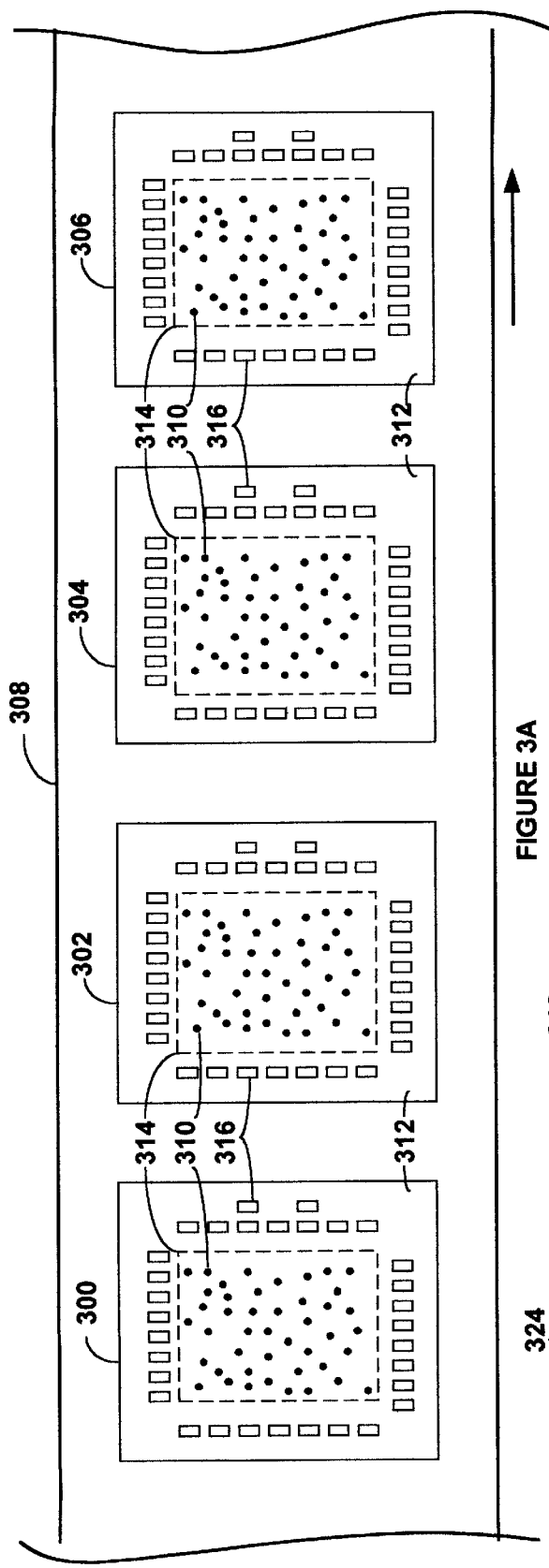
FIG. 3A is a plan view of four substrate packages on a boat ready to have flux applied to a region on the substrate packages having bumps.

FIG. 3A is a plan view of four substrate structures 300, 302, 304 and 306 mounted on a carrier or boat 308 that moves in the direction of the arrow 310. It is noted that the substrate structures 300, 302, 304 and 306 are identical. The dots, some of which are indicated at 310, represent the pads on the substrate material 312. The dashed lines 314 are the boundaries of the region on the substrate on which flux will be applied. The rectangular structures, some of which are indicated at 316, are capacitor pads formed on the substrate.

Figure 3B:
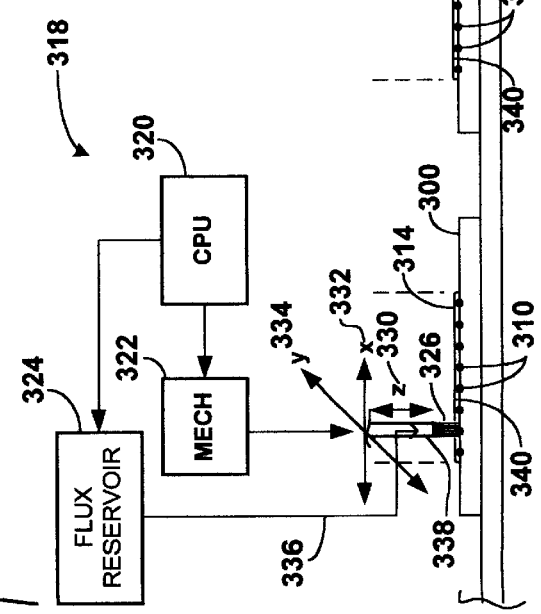
FIG. 3B is a side view of the four substrate packages shown in FIG. 3A showing flux being brushed onto one of the four packages and a chip ready to be applied to one of the four packages.

FIG. 3B is a side view of the four substrate structures 300, 302, 304 and 306 and the carrier 308 shown in FIG. 3A. A flux application structure is shown at 318. A CPU (central processing unit) 320 controls the mechanical stage 322 and the amount of flux that is dispensed via a valve from the flux reservoir 324. The mechanical stage 322 has a brush 326 structurally attached thereto and moves the brush in the x, y, and z directions as indicated at 328. The z direction is up and down from the surface of the substrate as indicated at 330. The x direction is in the direction of the movement of the carrier as indicated at 332. The y direction is in and out of the plane of the paper as indicated at 334. The flux is dispensed by a valve controlled by the CPU 320 into a tube indicated at 336 and then into the brush 326, as indicated at 338, or can be dispensed onto the brush 326 or directly onto the substrate. The CPU 320 controls the movement of the brush 326 via the mechanical stage 322 and the amount of flux that is dispensed from the flux reservoir 324 by a program that is empirically determined for the specific substrate and chip that are being assembled. The empirically generated program determines the pattern of the brush strokes that is required to achieve a uniform layer of flux to the regions 314 and the amount of flux that is required to be dispensed onto the surface to achieve the uniform layer of flux. The layer of flux is indicated at 340. A semiconductor chip 342 is shown in position to be placed on the substrate.

The empirically generated program determines the initial downward distance that the brush 326 travels toward the surface of the substrate, determines the distance that the brush 326 backs off of the surface of the substrate and determines the force that needs to be applied to the brush to hold it at the desired distance from the surface of the substrate. The empirically generated program can be determined using one of a number of available fluxes that are generally available commercially. The two major criteria used to determine the empirically generated program is uniformity of the flux coverage, thickness and the optimization of the throughput of the process. Different programs can be determined for different fluxes.

The flux is generally characterized by a viscosity and therefore any flux within the viscosity range of the flux that is used to determine the empirically generated program can be used for future applications for the specific substrate/chip combination that is being assembled. The flux materials are generally available from Alpha Metals, Indium Corporation, Kester and other manufacturers. A major advantage of having a program for each substrate/chip combination/flux is that the assembly system can be quickly changed from one substrate/chip/flux combination to another substrate/chip/flux combination.

In summary, the results and advantages of the automated programmed mechanical application method thus applies a controlled amount of flux to the substrate to achieve a desired uniform thickness by overcoming the surface tension of the flux/substrate interface. The empirically determined automated programmed mechanical application for each substrate/chip/flux combination is thus repeatable and operator independent.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An automated method of applying flux to a substrate on which a semiconductor chip is to be assembled in a flip chip configuration, the method comprising applying a controlled amount of flux to the substrate via a brush that applies the flux to the substrate in a programmed pattern of strokes applied by a brush attached to a movable mechanical state controlled by a program in a CPU, which is determined for a specific semiconductor device being assembled and overcomes a surface tension between a flux/substrate surface.

2. The automated method of claim 1 wherein the program in the CPU is empirically determined based upon uniformity of flux coverage of bumps on the specific semiconductor device being assembled and an optimization of manufacturing throughput of the specific semiconductor device being assembled.

3. The automated method of claim 2 wherein the controlled amount of flux to the substrate via the brush is controlled by the program in the CPU for the specific semiconductor device being assembled whereby the method is repeatable and not operator dependent.

4. The automated method of claim 3 wherein the movable mechanical stage controlled by the program in the CPU controls the motion of the brush in three dimensions.

5. The automated method of claim 4 wherein the movable mechanical stage initially contacts the substrate with the brush with an initial force and backs off until the brush is a programmed height above the substrate before beginning the programmed pattern of strokes.

6. The automated method of claim 5 wherein the movable mechanical stage applies a programmed downward force onto the substrate via the brush during the programmed pattern of strokes.

7. The automated method of claim 6 wherein the programmed downward force is controlled by the program in the CPU determined for the specific semiconductor device being assembled.

* * * * *